(12) United States Patent
Chiu et al.

(10) Patent No.: US 9,349,703 B2
(45) Date of Patent: May 24, 2016

(54) METHOD FOR MAKING HIGH DENSITY SUBSTRATE INTERCONNECT USING INKJET PRINTING

(71) Applicant: Intel Corporation, Santa Clara, CA (US)

(72) Inventors: Chia-Pin Chiu, Tempe, AZ (US); Kinya Ichikawa, Tsukuba (JP); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 14/036,719

(22) Filed: Sep. 25, 2013

(65) Prior Publication Data

US 2015/0084210 A1    Mar. 26, 2015

(51) Int. Cl.
*H01L 21/44* (2006.01)
*H01L 21/48* (2006.01)
(Continued)

(52) U.S. Cl.
CPC ............ *H01L 24/18* (2013.01); *H01L 21/4867* (2013.01); *H01L 23/5381* (2013.01); *H01L 23/5385* (2013.01); *H01L 24/24* (2013.01); *H01L 25/0655* (2013.01); *H05K 3/4694* (2013.01); *H01L 21/486* (2013.01); *H01L 23/3128* (2013.01); *H01L 23/49816* (2013.01); *H01L 23/49894* (2013.01); *H01L 23/5384* (2013.01); *H01L 24/16* (2013.01); *H01L 24/81* (2013.01); *H01L 2224/16225* (2013.01); *H01L 2224/81192* (2013.01);
(Continued)

(58) Field of Classification Search
CPC ............ H01L 21/4857; H01L 25/0655; H01L 21/4867; H01L 23/5381; H01L 2924/15311; H01L 23/3128; H01L 2224/16225; H01L 24/16; H01L 2924/15192; H01L 23/49816; H01L 21/486; H01L 23/49894; H01L 24/81; H01L 2224/81192; H01L 23/5384; H01L 2224/81801; H01L 24/19; H01L 2224/82; H01L 2924/15153; H01L 24/82; H01L 24/48
USPC .......................... 438/107, 108, 106, 622, 675
See application file for complete search history.

(56) References Cited

U.S. PATENT DOCUMENTS

| | | |
|---|---|---|
| 5,102,829 A | 4/1992 | Cohn |
| 5,111,278 A | 5/1992 | Eichelberger |

(Continued)

FOREIGN PATENT DOCUMENTS

| | | |
|---|---|---|
| CN | 104025289 A | 9/2014 |
| CN | 104952838 A | 9/2015 |

(Continued)

OTHER PUBLICATIONS

U.S. Appl. No. 13/630,297, filed Sep. 28, 2012, Localized High Density Substrate Routing.
(Continued)

*Primary Examiner* — Shouxiang Hu
(74) *Attorney, Agent, or Firm* — Schwegman Lundberg & Woessner, P.A.

(57) ABSTRACT

Generally discussed herein are systems and apparatuses that include a dense interconnect bridge and techniques for making the same. According to an example a technique can include creating a multidie substrate, printing an interconnect bridge on the multidie substrate, electrically coupling a first die to a second die by coupling the first and second dies through the interconnect bridge.

10 Claims, 7 Drawing Sheets

(51) Int. Cl.
*H01L 23/00* (2006.01)
*H01L 23/538* (2006.01)
*H01L 25/065* (2006.01)
*H01L 23/498* (2006.01)
*H01L 23/31* (2006.01)
*H05K 1/11* (2006.01)
*H05K 3/34* (2006.01)
*H05K 3/46* (2006.01)

(52) U.S. Cl.
CPC .......... *H01L 2224/81801* (2013.01); *H01L 2924/12042* (2013.01); *H01L 2924/15192* (2013.01); *H01L 2924/15311* (2013.01); *H05K 1/113* (2013.01); *H05K 3/3436* (2013.01); *H05K 3/4664* (2013.01); *H05K 2203/013* (2013.01)

(56) References Cited

U.S. PATENT DOCUMENTS

| | | | |
|---|---|---|---|
| 5,497,033 A | 3/1996 | Fillion et al. | |
| 5,703,400 A | 12/1997 | Wojnarowski et al. | |
| 5,745,984 A | 5/1998 | Cole, Jr. et al. | |
| 5,903,052 A | 5/1999 | Chen et al. | |
| 6,154,366 A | 11/2000 | Ma et al. | |
| 6,229,203 B1 | 5/2001 | Wojnarowski | |
| 6,271,469 B1 | 8/2001 | Ma et al. | |
| 6,495,914 B1 | 12/2002 | Sekine et al. | |
| 6,506,632 B1 | 1/2003 | Cheng et al. | |
| 7,042,081 B2 | 5/2006 | Wakisaka et al. | |
| 7,189,596 B1 | 3/2007 | Mu | |
| 7,659,143 B2 | 2/2010 | Tang et al. | |
| 7,777,351 B1 | 8/2010 | Berry et al. | |
| 7,851,894 B1 | 12/2010 | Scanlan | |
| 7,851,905 B2 | 12/2010 | Chrysler et al. | |
| 7,880,489 B2* | 2/2011 | Eldridge | G01R 3/00 29/830 |
| 8,064,224 B2 | 11/2011 | Mahajan et al. | |
| 8,093,704 B2 | 1/2012 | Palmer et al. | |
| 8,227,904 B2 | 7/2012 | Braunisch et al. | |
| 8,319,338 B1 | 11/2012 | Berry et al. | |
| 8,345,441 B1 | 1/2013 | Crisp et al. | |
| 8,482,111 B2 | 7/2013 | Haba | |
| 8,565,510 B2 | 10/2013 | Cohn et al. | |
| 8,823,158 B2 | 9/2014 | Oh et al. | |
| 8,883,563 B1 | 11/2014 | Haba et al. | |
| 8,912,670 B2 | 12/2014 | Teh et al. | |
| 9,136,236 B2 | 9/2015 | Starkston et al. | |
| 9,153,552 B2 | 10/2015 | Teh et al. | |
| 9,159,690 B2 | 10/2015 | Chiu et al. | |
| 2002/0070443 A1 | 6/2002 | Mu et al. | |
| 2003/0144405 A1 | 7/2003 | Lewin et al. | |
| 2003/0222344 A1 | 12/2003 | Hosoyamada et al. | |
| 2005/0067688 A1 | 3/2005 | Humpston | |
| 2005/0098891 A1 | 5/2005 | Wakabayashi et al. | |
| 2005/0230835 A1 | 10/2005 | Sunohara et al. | |
| 2006/0046468 A1 | 3/2006 | Akram et al. | |
| 2006/0087036 A1 | 4/2006 | Yang | |
| 2006/0097379 A1 | 5/2006 | Wang | |
| 2006/0226527 A1 | 10/2006 | Hatano et al. | |
| 2006/0286301 A1* | 12/2006 | Murata | H01L 21/4867 427/372.2 |
| 2007/0128855 A1* | 6/2007 | Cho | H05K 3/4664 438/637 |
| 2007/0138644 A1 | 6/2007 | McWilliams et al. | |
| 2007/0148819 A1 | 6/2007 | Haba et al. | |
| 2007/0205496 A1 | 9/2007 | Haba et al. | |
| 2008/0054448 A1 | 3/2008 | Lu et al. | |
| 2008/0315398 A1 | 12/2008 | Lo et al. | |
| 2009/0045524 A1 | 2/2009 | Mohammed et al. | |
| 2010/0072598 A1 | 3/2010 | Oh et al. | |
| 2011/0210443 A1 | 9/2011 | Hart et al. | |
| 2011/0233764 A1 | 9/2011 | Chang et al. | |
| 2012/0161331 A1 | 6/2012 | Gonzalez et al. | |
| 2013/0249116 A1 | 9/2013 | Mohammed et al. | |
| 2014/0091445 A1 | 4/2014 | Teh et al. | |
| 2014/0091474 A1 | 4/2014 | Starkston et al. | |
| 2014/0332946 A1 | 11/2014 | Oh et al. | |
| 2014/0367848 A1* | 12/2014 | Chi | H01L 24/24 257/737 |
| 2015/0084192 A1 | 3/2015 | Chiu et al. | |
| 2015/0104907 A1 | 4/2015 | Teh et al. | |
| 2015/0236681 A1 | 8/2015 | We et al. | |
| 2015/0340353 A1 | 11/2015 | Starkston et al. | |

FOREIGN PATENT DOCUMENTS

| | | |
|---|---|---|
| DE | 102011053161 A1 | 3/2012 |
| DE | 112013000494 T5 | 10/2014 |
| DE | 102014003462 A1 | 9/2015 |
| KR | 20110123297 A | 11/2011 |
| KR | 20120014099 A | 2/2012 |
| KR | 20130007049 A | 1/2013 |
| TW | 200409324 A | 6/2004 |
| TW | 343241 U | 10/2008 |
| TW | 201535667 A | 9/2015 |
| WO | WO-0215266 A2 | 2/2002 |
| WO | WO-2014051714 A1 | 4/2014 |

OTHER PUBLICATIONS

U.S. Appl. No. 13/631,205, filed Sep. 28, 2012, Bumpless Build-Up Layer Package Including an Integrated Heat Spreader.

U.S. Appl. No. 14/036,755, filed Sep. 25, 2013, Tall Solders for Through-Mold Interconnect.

"U.S. Appl. No. 13/631,205, Preliminary Amendment filed Dec. 12, 2012", 3 pgs.

"International Application Serial No. PCT/US2013/044001, International Search Report mailed Aug. 27, 2013", 3 pgs.

"International Application Serial No. PCT/US2013/044001, Written Opinion mailed Aug. 27, 2013", 6 pgs.

Braunisch, Henning, et al., "High-speed performance of Silicon Bridge die-to-die interconnects", Electrical Performance of Electronic Packaging and Systems (EPEPS), IEEE 20th Conference, (Oct. 23, 2011), 95-98.

Kumagai, K, et al., "A silicon interposer BGA package with Cu-filled TSV and multi-layer Cu-plating interconnect", Proc. IEEE Electronic Components and Technol. Conf. (ECTC), Lake Buena Vista, FL, (May 27-30, 2008), 571-576.

Sunohara, M, et al., "Silicon Interposer with TSVs (through silicon vias) and fine multilayer wiring", Proc. IEEE Electronic Components and Technol. Conf. (ECTC), (May 27-30, 2008), 847-852.

Towle, Steven N., et al., "Bumpless Build-Up Layer Packaging", (2001), 7 pgs.

U.S. Appl. No. 14/570,785, filed Dec. 15, 2014, Bumpless Build-Up Layer Package Including an Integrated Heat Spreader.

"U.S. Appl. No. 13/630,297, Non Final Office Action mailed Mar. 3, 2015", 11 pgs.

"U.S. Appl. No. 13/630,297, Notice of Allowance mailed May 8, 2015", 8 pgs.

"U.S. Appl. No. 13/630,297, Response filed Apr. 22, 2015 to Non Final Office Action mailed Mar. 3, 2015", 9 pgs.

"U.S. Appl. No. 13/630,297, Response filed Nov. 12, 2014 to Restriction Requirement mailed Sep. 12, 2014", 9 pgs.

"U.S. Appl. No. 13/630,297, Restriction Requirement mailed Sep. 12, 2014", 7 pgs.

"U.S. Appl. No. 13/631,205, Notice of Allowance mailed Aug. 1, 2014", 11 pgs.

"U.S. Appl. No. 13/631,205, Response filed Jun. 30, 2014 to Restriction Requirement mailed Apr. 29, 2014", 6 pgs.

"U.S. Appl. No. 13/631,205, Restriction Requirement mailed Apr. 29, 2014", 6 pgs.

"U.S. Appl. No. 14/036,755, Examiner Interview Summary mailed Feb. 5, 2015", 3 pgs.

"U.S. Appl. No. 14/036,755, Examiner Interview Summary mailed May 20, 2015", 3 pgs.

"U.S. Appl. No. 14/036,755, Final Office Action mailed Apr. 1, 2015", 15 pgs.

(56) References Cited

OTHER PUBLICATIONS

"U.S. Appl. No. 14/036,755, Non Final Office Action mailed Dec. 5, 2014", 16 pgs.

"U.S. Appl. No. 14/036,755, Notice of Allowance mailed Jun. 5, 2015", 5 pgs.

"U.S. Appl. No. 14/036,755, Response filed Feb. 6, 2015 to Non Final Office Action mailed Dec. 5, 2014", 15 pgs.

"U.S. Appl. No. 14/036,755, Response filed May 15, 2015 to Final Office Action mailed Apr. 1, 2015", 9 pgs.

"U.S. Appl. No. 14/036,755, Response filed Sep. 17, 2014 to Restriction Requirement mailed Jul. 17, 2014", 7 pgs.

"U.S. Appl. No. 14/036,755, Restriction Requirement mailed Jul. 17, 2014", 6 pgs.

"U.S. Appl. No. 14/570,785, Non Final Office Action mailed Feb. 26, 2015", 7 pgs.

"U.S. Appl. No. 14/570,785, Notice of Allowance mailed May 28, 2015", 8 pgs.

"U.S. Appl. No. 14/570,785, Response May 14, 2015 to Non Final Office Action mailed Feb. 26, 2015", 5 pgs.

"Germany Application Serial No. 102014003462.3, Office Action mailed Dec. 3, 2014", W/ English Translation, 19 pgs.

"Germany Application Serial No. 102014003462.3, Response filed Apr. 8, 2015 Office Action mailed Dec. 3, 2014", W/ English Claims, 22 pgs.

"International Application Serial No. PCT/US2013/044001, International Preliminary Report on Patentability mailed Apr. 9, 2015", 8 pgs.

"Korean Application Serial No. 2014-0030620, Office Action mailed by May 7, 2015", W/ English Translation, 9 pgs.

U.S. Appl. No. 14/875,247, filed Oct. 5, 2015, Bumpless Build-Up Layer Package Including an Integrated Heat Spreader.

U.S. Appl. No. 14/879,418, filed Oct. 9, 2015, Tall Solders for Through-Mold Interconnect.

"U.S. Appl. No. 14/036,755, Notice of Allowability mailed Aug. 24, 2015", 2 pgs.

"U.S. Appl. No. 14/036,755, Supplemental Notice of Allowability mailed Jul. 15, 2015", 2 pgs.

"U.S. Appl. No. 14/036,755, Supplemental Notice of Allowability mailed Sep. 3, 2015", 2 pgs.

"U.S. Appl. No. 14/818,902, Preliminary Amdnemdne filed Aug. 6, 2015", 7 pgs.

"Korean Application Serial No. 2014-0030620, Response filed Jul. 7, 2015 to Office Action mailed by May 7, 2015", w/ English Claims, 31 pgs.

U.S. Appl. No. 14/818,902, filed Aug. 5, 2015, Localized High Density Substrate Routing.

"U.S. Appl. No. 14/818,902, Notice of Allowance mailed Oct. 15, 2015", 9 pgs.

"U.S. Appl. No. 14/879,418, Preliminary Amendment filed Oct. 26, 2015", 7 pgs.

"Taiwanese Application Serial No. 103107035, Office Action mailed Oct. 23, 2015", w/ English Translation, 7 pgs.

* cited by examiner

METHOD FOR MAKING HIGH DENSITY SUBSTRATE INTERCONNECT USING INKJET PRINTING

TECHNICAL FIELD

Examples generally relate to multichip packages, and more specifically to creating a multichip package with a dense interconnect using inkjet printing technology.

TECHNICAL BACKGROUND

Semiconductor devices, such as electronic devices, can include substrate routing that is of a lower density than some of the routing in a chip that is attached to the substrate. Such devices can include complex routing schemes especially in areas where the attached chip includes higher density routing than the routing in the substrate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate to apparatuses and systems that include a printed high density interconnect bridge. Examples also relate to techniques of printing a high density interconnect bridge on a substrate.

The following description includes terms, such as upper, lower, first, second, etc. that are used for descriptive purposes only and are not to be construed as limiting. The examples of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials.

Current board design can be created by incorporating a number of heterogeneous functions, such as Computer Processing Unit (CPU) logic, graphics functions, cache memory, and other functions to create integrated System on Chip (SoC) designs. Such SoC packages can lower the complexity of a product design and can reduce the number of components required by the product. Picking individual packages that implement these functions and designing the board around the packages chosen can be complex. Using individual packages can increase the system board area, power loss, complexity, component count, or costs over an integrated SoC package solution.

The input/output (IO) density in a package substrate can be a function of a substrate's minimum pad size, minimum trace dimensions, minimum space dimensions, or the capability of the manufacturing process. The routing density in a multichip substrate can be several orders of magnitude lower (e.g., about 100 times) than chip level routing density. This routing density can impact cost, size, and performance of a product.

A way to reduce the size of a product can include utilizing a silicon interposer in a package to provide a high density chip to chip interconnection. Such a solution includes a higher cost due to the cost of the silicon interposer, additional assembly and process steps, and compounding yield loss.

A substrate can include a high density interconnect bridge in a BBUL or other substrate with multiple embedded dice (e.g., chips) embedded, at least partially, therein. Such a solution can eliminate a first level interconnect (FLI) die attach and use panel processing to reduce the overall cost. Such a solution can allow a high density interconnect to be situated where it would be advantageous and allow low density interconnect (e.g., routing with a substrate routing technique) where it would be advantageous, such as for routing power or ground lines.

Substrate routing can take up a significant amount of space and can be a factor in the overall size of a die package. By including typical substrate routing techniques, which can result in less dense routing than chip routing techniques, there may not be enough space to route the die without routing through the die. Integrating a high density interconnect bridge in a package or substrate, such as a BBUL package or substrate, can allow for an increase in overall local routing and interconnect density of a package, thus helping to reduce size and cost. One previous solution included embedding a high density, silicon interconnect bridge in a substrate. Assembly of such a package is challenging due to tight tolerance requirements in the x, y, and z directions. The tight tolerance requirements are due, at least in part, to alignment and fitting issues in connecting the chip interconnect bridge to the substrate. In addition, using a chip interconnect bridge (e.g., a silicon interconnect bridge) requires embedding the interconnect bridge during the substrate fabrication process.

By printing, such as by using an inkjet printer, an interconnect bridge on a substrate and then attaching one or more dies to the interconnect bridge, the tight tolerances and difficulty in assembling the package can be avoided. Also, by inkjet printing the interconnect bridge, routing can be changed after the substrate fabrication process, thus allowing for added flexibility in the routing design. Further, inkjet printing allows for more package warpage than the high density chip interconnect bridge approach, since inkjet printing can be applied to uneven or non-flat surfaces. Also, inkjet printing the interconnect bridge can eliminate the wafer thinning process required for the high density chip interconnect bridge approach, and can also eliminate any precautions needed to ensure the chip bridge is not damaged when handling the thin chip interconnect.

Inkjet printing technology can allow for traces as small as a micrometer, or even smaller. The spaces between the traces can be a micrometer or smaller using inkjet printing technology. The same technology can be used to create 3D structures such as micro-bumps, pads, or vias, among others. Inkjet printing technology can also be used to print dielectric material and fill spaces between traces or routing layers, among others. As used herein "print" means to dispense powder or molten material out of a nozzle. Printing is an additive process, as opposed to a subtractive process.

Reference will now be made to the drawings wherein like structures will be provided with like suffix reference designations. In order to show the structures of various examples clearly, the drawings included herein are diagrammatic representations of integrated circuit structures. Thus, the actual appearance of the fabricated structures, for example in a photomicrograph, may appear different while still incorporating subject matter of the illustrated examples. Moreover, the drawings show the structures to aid in understanding the illustrated examples.

Figure 1A:
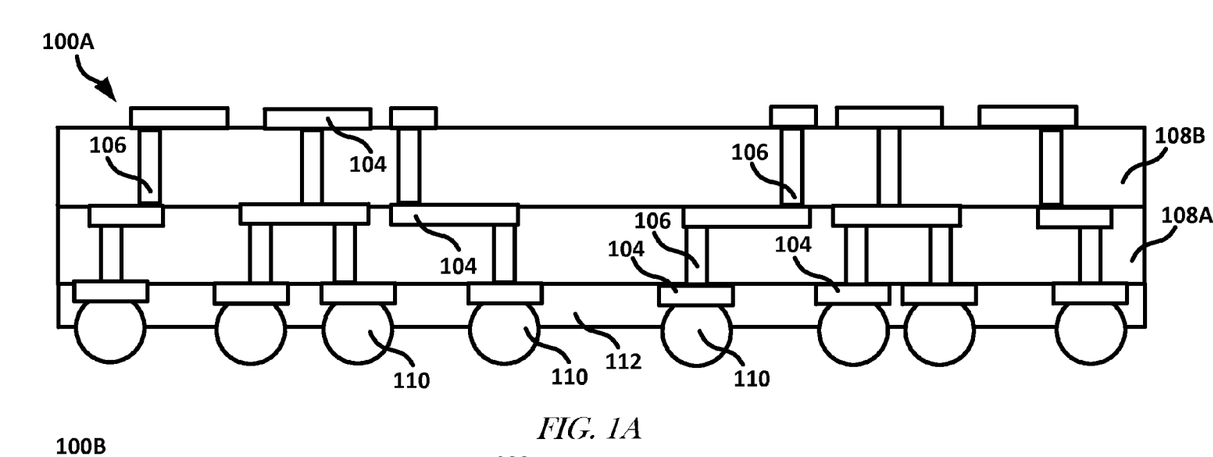
FIGS. 1A-1D illustrate stages of an example of a process of creating a microelectronic die package.

FIG. 1A shows an example of a substrate 100A. The substrate 100A can be a Bumpless BuildUp Layer (BBUL) substrate. The substrate 100A can include a plurality of low density interconnect pads 104 (e.g., pads created using substrate routing technology, as opposed to chip routing technology). The substrate 100A can include a plurality of vias 106 that electrically couple low density interconnect pads 104 between buildup layers 108A and 108B. The buildup layers 108A and 108B can include copper (Cu) interconnects (e.g., low density vias 106) and dielectric buildup layers (e.g., Anjinomoto Buildup Film (ABF)). The substrate 100A can include a solder resist 112 situated on a buildup layer 108A and between solder balls 110 or other electrically conductive interconnect elements.

Figure 1B:
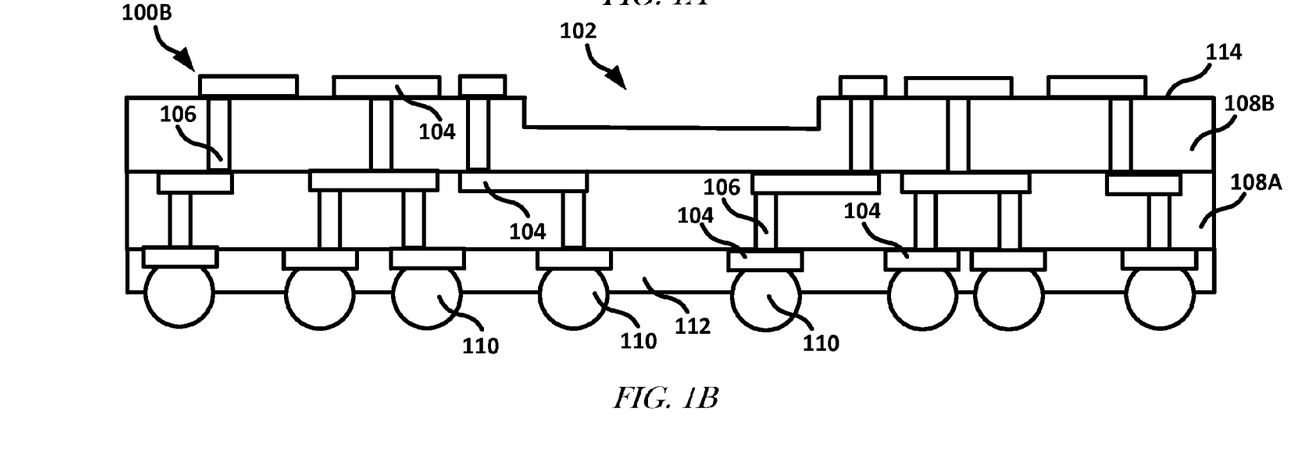

FIG. 1B shows a substrate 100B with a cavity 102 formed in an upper surface 114 of the buildup layer 108B. The cavity 102 can be formed into the substrate 100 during fabrication thereof or can be mechanically machined or laser ablated into the substrate 100 post-fabrication.

Figure 1C:
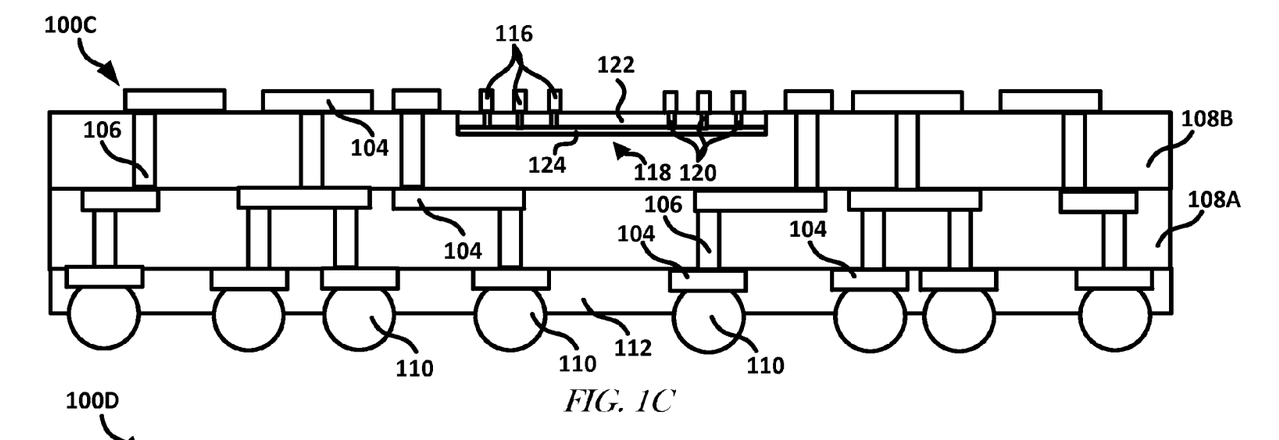

FIG. 1C shows the substrate of FIG. 1B after a high density interconnect bridge 118 and high density interconnect pads 116 have been printed on or at least partially in the cavity 102. The high density interconnect pads 116 can be printed to be denser (e.g., more pads per volume) than the low density interconnect pads 104. In one or more examples, the high density interconnect pads 116 can printed up to 100 times denser than the low density interconnect pads 104. The high density interconnect bridge 118 can include one or more printed traces 124, one or more printed vias 120, and dielectric 122 situated over and between the traces 124 and between the vias 120. FIGS. 2A-2E show an example of a process for printing the interconnect bridge 118 in more detail.

Figure 1D:
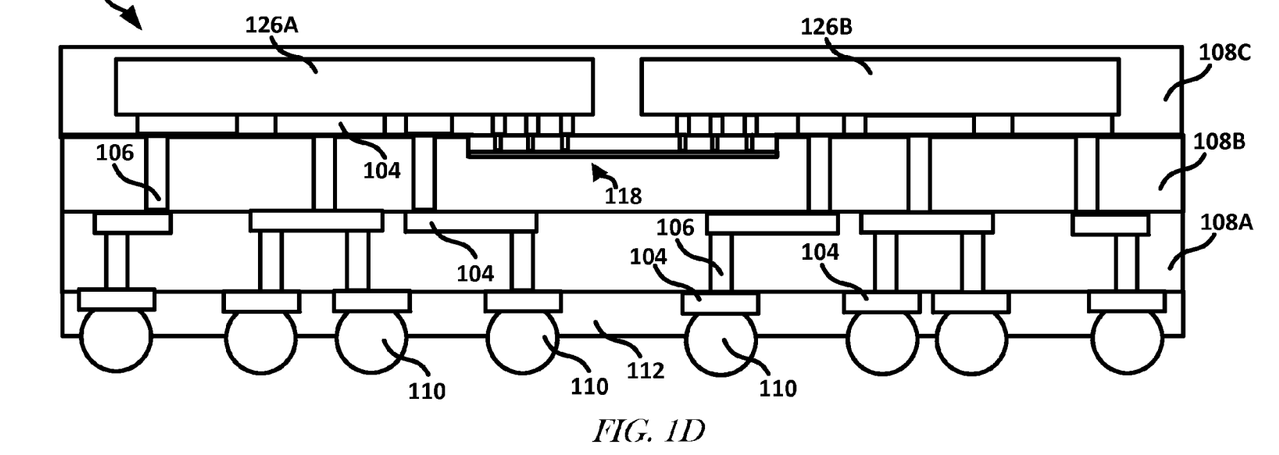

FIG. 1D shows the substrate of FIG. 1C with first and second dice 126A and 126B electrically and mechanically coupled to low density interconnect pads 104 and high density interconnect pads 116. The first and second dice 126A and 126B can be encapsulated in molding or a buildup layer 108C. A buildup layer 108 can be used when the die 126 is to be embedded. In one or more embodiments, the dice 126A and 126B may not be completely encapsulated as shown in FIG. 1D. In such embodiments, the dice 126A and 126B can be partially surrounded by a molding or an underfill, so as to protect the electrical connections made to the substrate 100.

FIGS. 2A-2E illustrate an example of a process for inkjet printing a high density interconnect bridge 118. At FIG. 2A one or more traces 124 can be printed on a substrate 200. The material used to print the traces 124 can be gold, silver, copper, or other suitably electrically conductive and printable materials. The printed material can be sintered, such as by microwave sintering or laser sintering, so as to fuse at least some of the printed particles that make up the traces 124 together. The sintering process can help solidify the printed trace 124 and increase the electrical conductivity and mechanical strength of the printed trace 124. At FIG. 2B, one or more vias 120 can be printed on the one or more traces 124. Similar to the traces 124, the vias 120 can be sintered after they are printed.

Figure 2A:
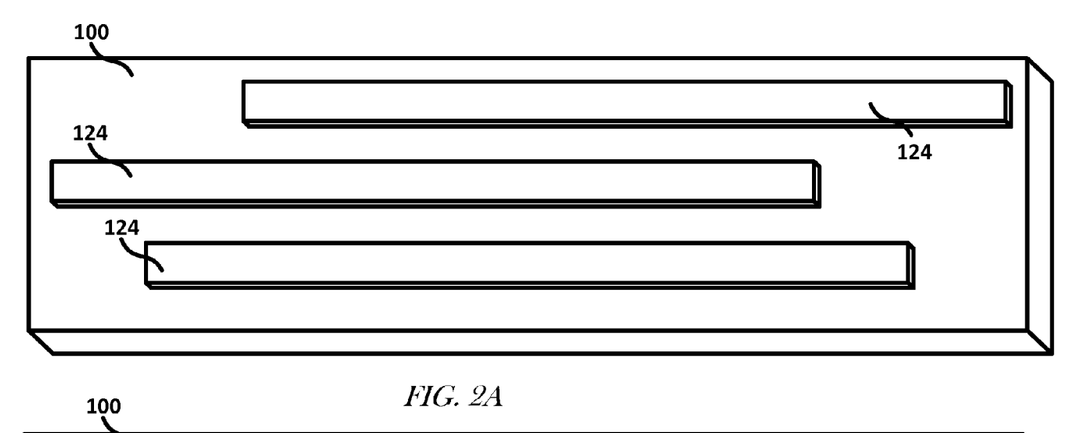
FIGS. 2A-2E illustrate stages of an example of a process for creating an interconnect bridge using inkjet printing technology.
Figure 2B:
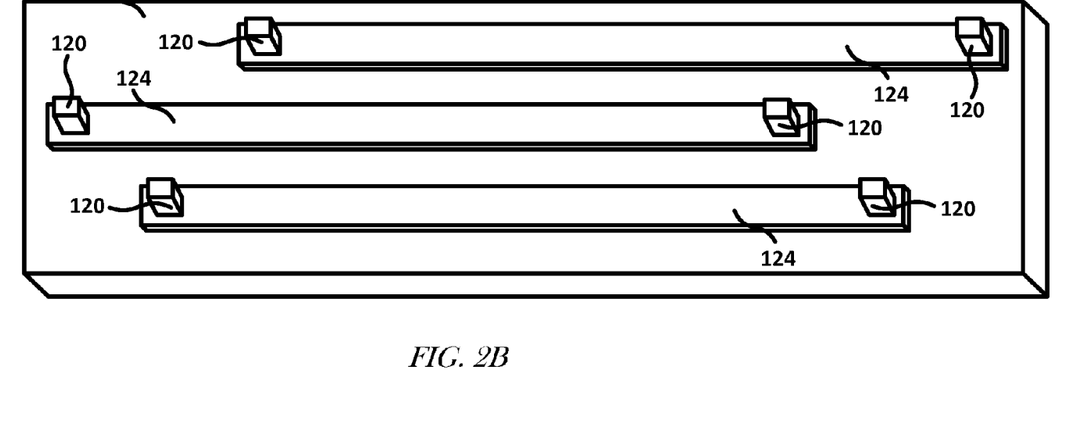
Figure 2C:
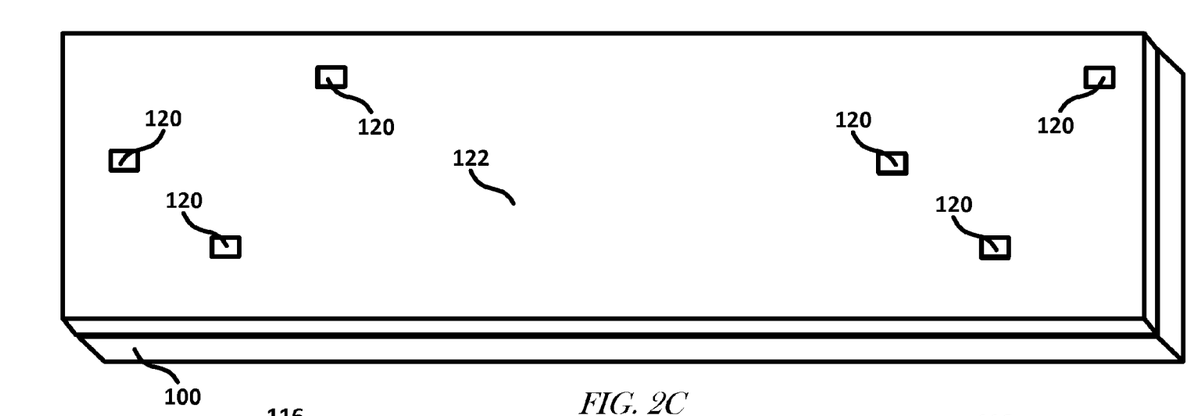

Dielectric 122 can be printed in between, on, or around the traces 124 and vias 120, such as shown in FIG. 2C. The dielectric 122 can be an organic dielectric, solder resist, ABF film, epoxy, or a combination thereof, among others. The dielectric 122 can be baked after it is printed so as to cure or harden the dielectric 122 and to insulate the traces 124, vias 120, and pads 116 from bridging. One or more pads 116 can be printed so as to form a contact with one or more of the vias 120. The pads 116 can be printed on, over, or around the dielectric 122. The pads 116 can be printed using one of at least two methods. The first method includes printing a thin layer of the pad 116, sintering the thin layer, and repeating until the pad 116 has the specified height. The second method can include using a high-viscosity printing material to print the entire pad 116 and then sintering the high viscosity material. The high viscosity material can help the pad 116 hold shape after printing or before sintering.

Sintering printed metals (e.g., traces, vias, pads, or the like) can produce a metal structure with a sintered grain morphology. The sintered grain morphology is a different morphology than a metal formed in a lithographic process (e.g., a sheet metal). The differences between the two morphologies can be seen using an electron microscope, scanning probe microscope, or other microscope. The sintered grain morphology metals can have different properties (e.g., mechanical strength, conductivity, or the like) than the metals formed using a lithographic process. Sintering includes diffusing atoms of a material at a temperature lower than the melting point of the material being sintered so as to fuse atoms together.

Figure 2D:
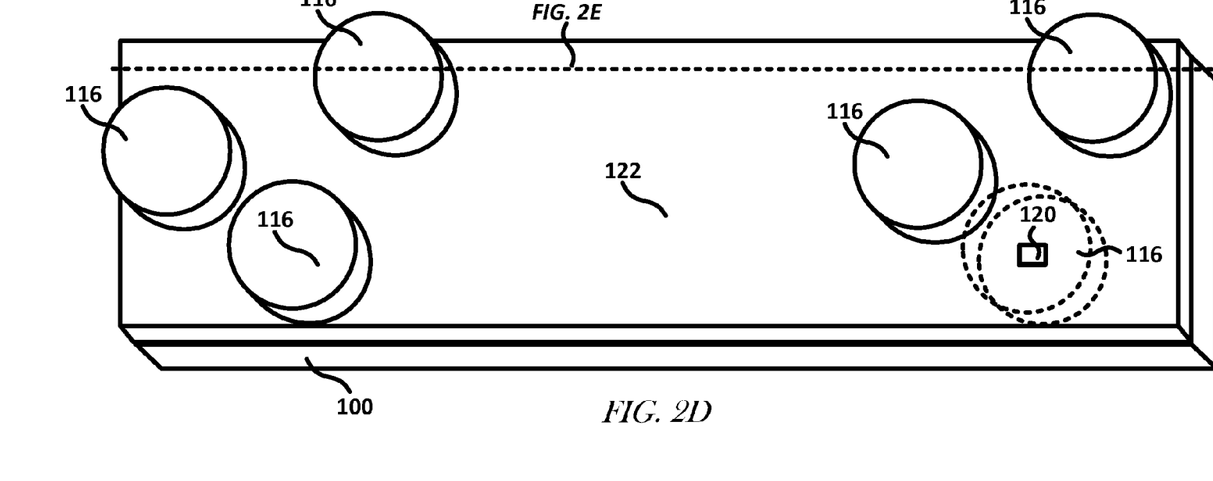
Figure 2E:
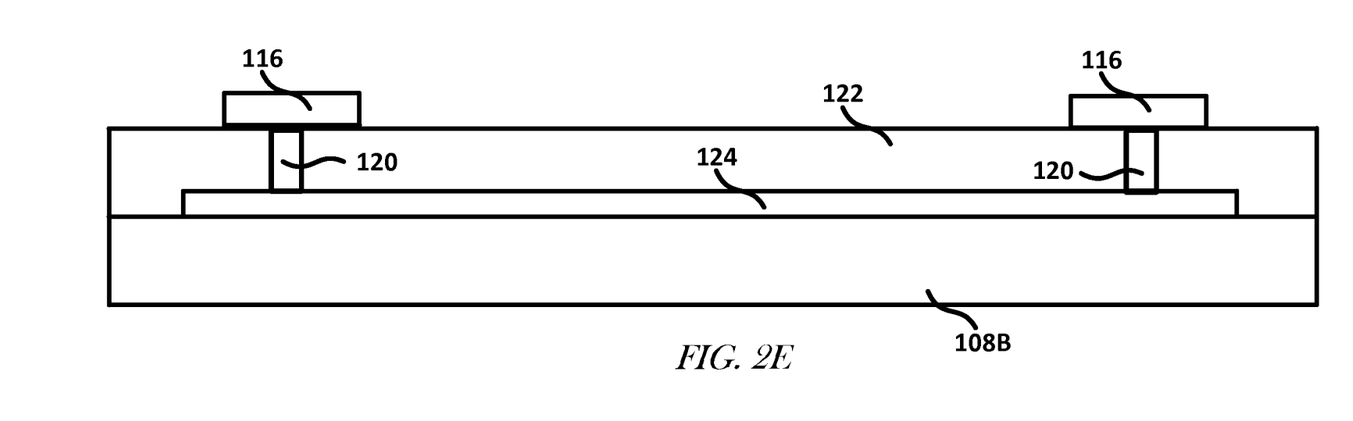

FIG. 2E illustrates a cross-section of the substrate shown in FIG. 2D. As can be seen in FIG. 2E, the dielectric material 122 can be printed on, over, under, or around the traces 124, vias 120, pads 116, and the buildup layer 108B. The via 120 can be printed and sintered so as to be on or in electrical contact with the trace 124. The pad 116 can be printed and sintered so as to be on or in electrical or mechanical contact with the trace 124. The pad 116 can be a Package on Package (PoP) pad, a flip-chip pad, or other type of pad.

Figure 3:
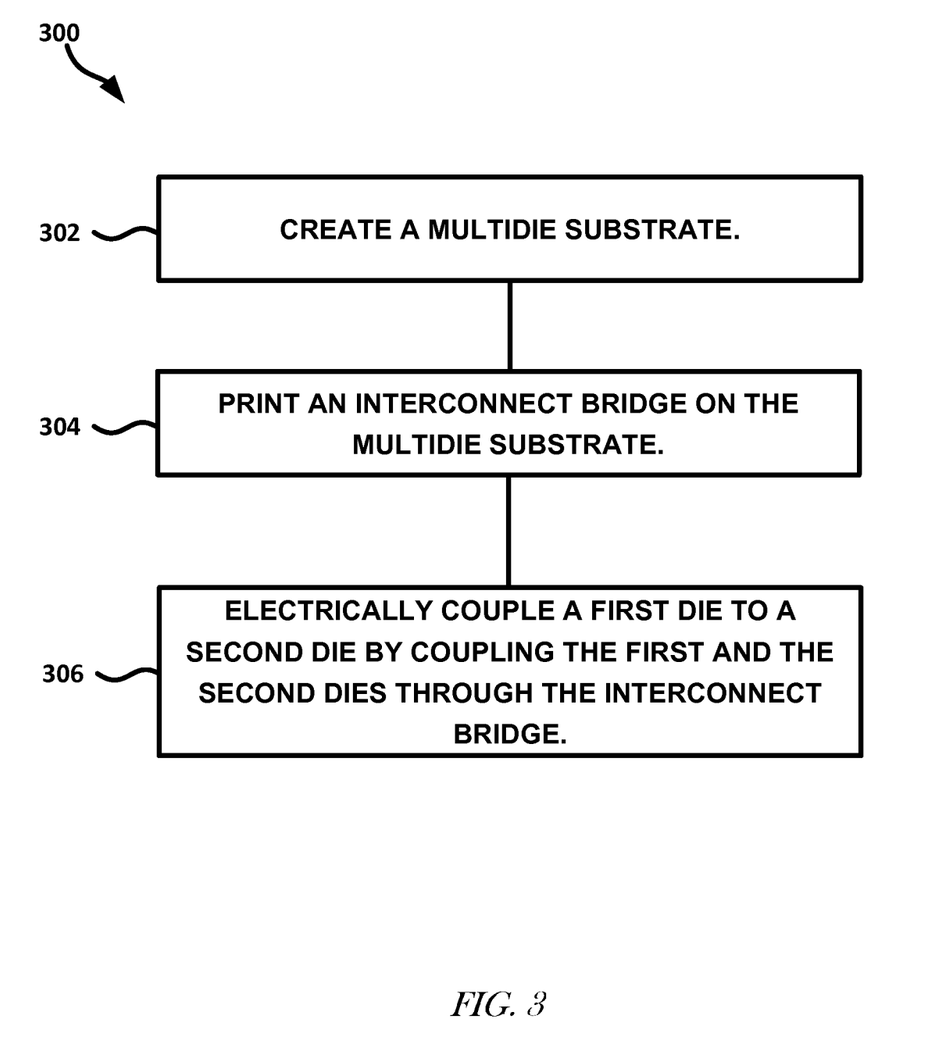
FIG. 3 illustrates an example of a technique for creating an interconnect bridge using printing technology.

FIG. 3 illustrates an example of a technique 300 for inkjet printing an interconnect bridge 118. At 302, a multidie substrate can be created. The multidie substrate can be configured to have at least two dies soldered thereto, such as by including pads that the pads can be electrically and mechanically coupled to. The multidie substrate can be a BBUL substrate or a substrate made from any multidie manufacturing process. At 304, an interconnect bridge 118 can be printed on the multidie substrate. Printing the interconnect bridge 118 on the substrate can include printing one or more traces 124 in the cavity 102. Printing the interconnect bridge 118 in the cavity 102 can include printing a via 120 on a trace 124 of the one or more traces 124. Printing the interconnect bridge 118 in the cavity can include printing a pad 116 on the via 120. Printing the interconnect bridge 118 in the cavity 102 can include printing a dielectric 122 on the via 120 before printing the pad 116 on the via 120. The cavity 102 in the multidie substrate can be formed in the multidie substrate during fabrication of the substrate. The cavity 102 in the substrate can be formed in the substrate after the substrate is fabricated. The interconnect bridge 118 can be printed, such that at least a substantial portion of the interconnect bridge 118 (e.g., the traces 124, at least a portion of the vias 120, and at least a portion of the dielectric and possibly part of the pad 116 is printed in the cavity 102.

The one or more printed traces 124 can be sintered before the via 120 is printed. The via 120 can be sintered before the dielectric 122 is printed. The dielectric 122 can be baked before the pad 116 is printed. The printed pad 116 can be sintered after at least one layer of the pad 116 is printed.

At 306, a first die 126A can be electrically coupled to a second die 126B, such as by coupling the first and the second dies through the interconnect bridge 118. Coupling the first die 126A to the interconnect bridge 118 can include electrically coupling a contact on the first die 126A to the pad 116.

Figure 4:
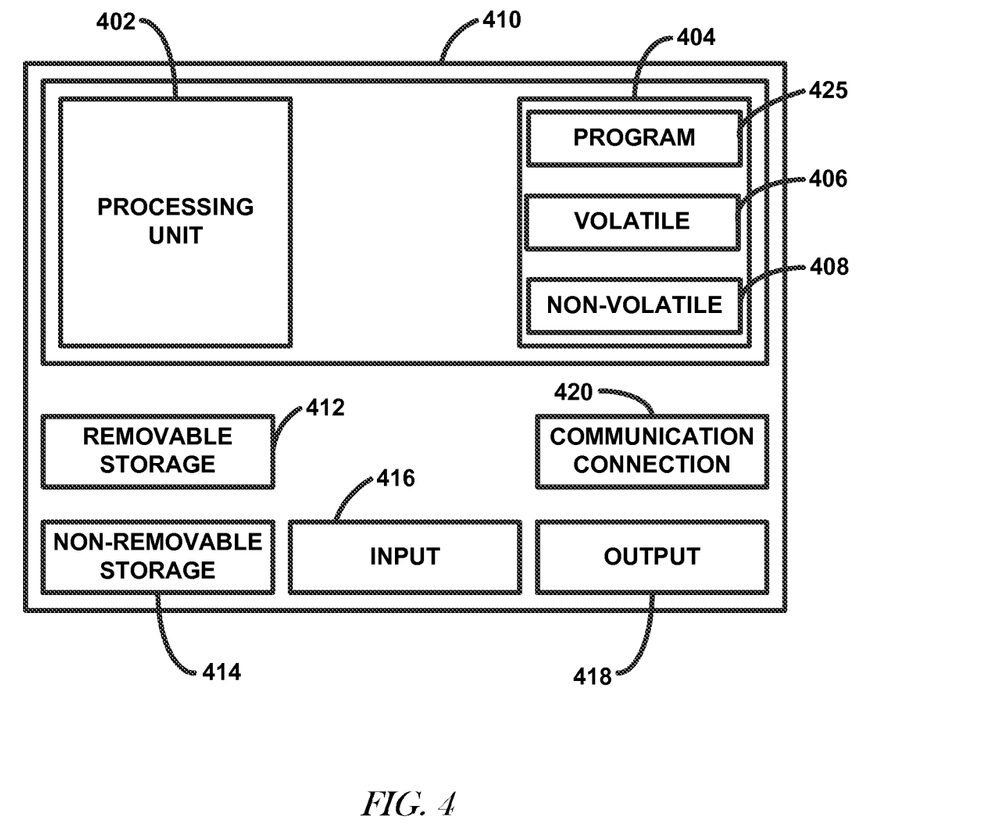
FIG. 4 is a schematic of an example of an electronic system.

FIG. 4 is a block diagram of a computing device, according to an example embodiment. One or more of the foregoing examples of packages that include a printed interconnect bridge 118, such as those manufactured according to a foregoing process, may be utilized in a computing system, such as computing system 400 of FIG. 4. In one embodiment, multiple such computer systems are utilized in a distributed network to implement multiple components in a transaction based environment. An object-oriented, service-oriented, or other architecture may be used to implement such functions and communicate between the multiple systems and components. One example computing device in the form of a computer 410, may include a processing unit 402, memory 404, removable storage 412, and non-removable storage 414. Memory 404 may include volatile memory 406 and non-volatile memory 408. Computer 410 may include—or have access to a computing environment that includes—a variety of computer-readable media, such as volatile memory 406 and non-volatile memory 408, removable storage 412 and non-removable storage 414. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 410 may include or have access to a computing environment that includes input 416, output 418, and a communication connection 420. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 402 of the computer 410. A hard drive, CD-ROM, and RAM are some examples of articles including a non-transitory computer-readable medium. For example, a computer program 425 capable of providing a generic technique to perform access control check for data access and/or for doing an operation on one of the servers in a component object model (COM) based system according to the teachings of the present invention may be included on a CD-ROM and loaded from the CD-ROM to a hard drive. The computer-readable instructions allow computer 410 to provide generic access controls in a COM based computer network system having multiple users and servers.

EXAMPLES AND NOTES

The present subject matter may be described by way of several examples.

Example 1 can include subject matter (such as a system, apparatus, method, tangible machine readable medium, etc.) that can include a multi-chip electronic package. The example can include creating a multidie substrate, printing an interconnect bridge on the multidie substrate, and electrically coupling a first die to a second die by coupling the first and second dies through the interconnect bridge.

In Example 2, printing the interconnect bridge of Example 1 can include printing one or more traces on the multidie substrate.

In Example 3, printing the interconnect bridge on the multidie substrate of at least one of Examples 1 and 2 includes printing a via on a trace of the one or more traces.

In Example 4, printing the interconnect bridge on the multidie substrate of at least one of Examples 1-3 includes printing a pad on the via.

In Example 5, coupling the first die to the interconnect bridge of at least one of Examples 1-4 includes electrically coupling a contact on the first die to the pad.

In Example 6, printing the interconnect bridge in the cavity of at least one of Examples 1-5 includes printing a dielectric on the via before printing the pad on the via.

In Example 7, the method of at least one of Examples 1-6 can include sintering the one or more printed traces before printer the via.

In Example 8, the method of at least one of Examples 1-7 can include sintering the printed via before printing the dielectric.

In Example 9, the method of at least one of Examples 1-8 can include baking the printed dielectric before printing the pad.

In Example 10, the method of at least one of Examples 1-9 can include sintering the printed pad.

In Example 11, creating the multidie substrate of at least one of Examples 1-10 can include forming a cavity in the multidie substrate during fabrication of the substrate. wherein printing the interconnect bridge includes printing the interconnect bridge in the cavity.

In Example 12, the method of at least one of Examples 1-11 can include creating a cavity in the substrate after fabricating the substrate.

In Example 13, printing the interconnect bridge of at least one of Examples 1-12 can include printing the interconnect bridge in the cavity.

In Example 14, creating the multidie substrate can include creating a bumpless buildup layer substrate.

In Example 15, the first die can be a memory die and the second die can be a processor die.

In Example 16, the pad can be a flip-chip pad.

In Example 17 an integrated circuit package can include a multidie substrate, an interconnect bridge on the multidie substrate, and a first die electrically coupled to a second die through the interconnect bridge.

In Example 18, the interconnect bridge of at least one of Examples 1-17, can include one or more traces, vias, or pads that exhibit a sintered grain morphology.

In Example 19, the first die of at least one of Examples 1-18 can include a memory die.

In Example 20, the second die of at least one of Examples 1-19 can include a processor die.

In Example 21, the multidie substrate of at least one of Examples 1-20 can include a bumpless buildup layer substrate.

In Example 22, the one or more pads of at least one of Examples 1-21 can include a flip-chip pad.

In Example 23, the multidie substrate of at least one of Examples 1-22 can include a cavity and the interconnect bridge can be situated, at least partially, in the cavity.

In Example 24, the integrated circuit package of at least one of Examples 1-23 can include a molding at least partially surrounding the first and second dies.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method of making a multidie package comprising:
creating a multidie substrate with low density routing therein and low density interconnect pads on a surface of the substrate;
forming a cavity in the surface of the created substrate;
inkjet printing an interconnect bridge on the created multidie substrate, the interconnect bridge including high density routing therein and high density interconnect pads on a surface of the interconnect bridge, the high density routing including traces with a micrometer or less of space between the traces, wherein inkjet printing the interconnect bridge includes:
  inkjet printing high density traces on the substrate in the cavity,
  sintering the printed high density traces,
  inkjet printing one or more high density vias on the high density traces and in the cavity,
  sintering the one or more printed high density vias,
  inkjet printing dielectric around the sintered high density traces and sintered high density vias and in the cavity,
  inkjet printing the high density interconnect pads on the sintered high density vias, and
  sintering the printed high density interconnect pads; and
electrically coupling a first die to a second die by coupling the first and second dies to the high density interconnect pads and through the interconnect bridge, wherein each of the first die and the second die at least partially overlaps with the cavity.

2. The method of claim 1, wherein forming the cavity in the surface of the created substrate includes creating a cavity in the substrate after fabricating the substrate.

3. The method of claim 1, wherein the multidie substrate is a bumpless buildup layer substrate.

4. The method of claim 1, wherein inkjet printing the high density interconnect pads includes inkjet printing multiple layers of conductive material and sintering the conductive material after printing each layer.

5. The method of claim 1, wherein inkjet printing the high density interconnect pads includes inkjet printing a single layer of conductive material.

6. A method of making a multidie computer package comprising:
creating a bumpless buildup layer multidie substrate with low density routing therein and low density interconnect pads on a surface of the multidie substrate;
forming a cavity in the created multidie substrate;
printing an interconnect bridge on the created multidie substrate, the interconnect bridge including high density routing therein and high density interconnect pads on a surface of the interconnect bridge, wherein printing the interconnect bridge includes:
  printing high density traces on the substrate in the cavity,
  sintering the printed high density traces,
  printing one or more high density vias on the high density traces and in the cavity,
  sintering the one or more printed high density vias,
  printing dielectric around the sintered high density traces and sintered high density vias and in the cavity,
  printing the high density interconnect pads on the sintered high density vias, and
  sintering the printed high density interconnect pads; and
electrically coupling a memory die to a computer processor die by coupling the memory die and computer processor die to the high density interconnect pads and through the interconnect bridge, wherein each of the computer processor die and the memory die at least partially overlaps with the cavity.

7. The method of claim 6, wherein forming the cavity in the multidie substrate includes forming the cavity in the substrate after fabricating the multidie substrate.

8. The method of claim 6, wherein the printed high density interconnect pads are flip-chip pads.

9. The method of claim 6, wherein printing the high density interconnect pads includes inkjet printing multiple layers of conductive material and sintering the conductive material after printing each layer.

10. The method of claim 6, wherein inkjet printing the high density interconnect pads includes inkjet printing a single layer of conductive material.

* * * * *